(12) United States Patent
Yamasaki

(10) Patent No.: US 7,742,017 B2
(45) Date of Patent: Jun. 22, 2010

(54) ELECTRO-OPTICAL DEVICE AND ELECTRONIC APPARATUS HAVING THE SAME

(75) Inventor: Ryosuke Yamasaki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 878 days.

(21) Appl. No.: 11/438,561

(22) Filed: May 22, 2006

(65) Prior Publication Data

US 2006/0270083 A1 Nov. 30, 2006

(30) Foreign Application Priority Data

May 26, 2005 (JP) .............................. 2005-154112
Jan. 12, 2006 (JP) .............................. 2006-004527

(51) Int. Cl.
*H01L 33/00* (2010.01)
(52) U.S. Cl. ..................... 345/55; 438/29; 438/396; 257/98; 361/312
(58) Field of Classification Search ................ 345/55; 361/312; 438/29, 396; 257/98
See application file for complete search history.

(56) References Cited

U.S. PATENT DOCUMENTS 5,742,471 A * 4/1998 Barbee et al. ............... 361/312

6,683,591 B2 * 1/2004 Hashimoto et al. ........... 345/87
2004/0141097 A1 7/2004 Takahara et al.

FOREIGN PATENT DOCUMENTS

| JP | 2001-183992 | 7/2001 |
| JP | 2003-295166 | 10/2003 |
| JP | A-2003-347543 | 12/2003 |
| JP | 2004-170912 | 6/2004 |

\* cited by examiner

*Primary Examiner*—Henry N Tran
*Assistant Examiner*—Christopher E Leiby
(74) *Attorney, Agent, or Firm*—AdvantEdge Law Group, LLC

(57) ABSTRACT

An electro-optical device includes a holding capacitor with a first electrode electrically connected to a transistor and a pixel electrode, a second electrode disposed opposite to the first electrode, and a multilayer dielectric film structure disposed between the first electrode and the second electrode. The multilayer dielectric film structure includes a low dielectric film and first and second high dielectric films. The first and second high dielectric films sandwich the low dielectric film from a first electrode side and a second electrode side, respectively. Both of the first and second high dielectric films have a permittivity that is higher than that of the low dielectric film.

4 Claims, 12 Drawing Sheets

ELECTRO-OPTICAL DEVICE AND ELECTRONIC APPARATUS HAVING THE SAME

BACKGROUND

1. Technical Field

The present invention relates to, for example, an electro-optical device such as LCD, etc., particularly, an electro-optical device and an electronic apparatus having the same adopting a reversal driving system in which the polarity reversal of a driving voltage is regularly implemented for each pixel line or pixel row so that voltages of pixel electrodes adjacent to each other in a line direction or row direction of a pixel show a reverse polarity to each other.

2. Related Art

In this kind of electro-optical device, there is adopted the reversal driving system in which the voltage polarity applied to each pixel electrode is reversed in accordance with a predetermined rule for the prevention of a deterioration of an electro-optical material and a crosstalk or a flicker on a display image caused by the application of D.C. voltage.

During the display corresponding to an image signal of one frame or field out of them is implemented, as the reversal driving system which enables relatively easy controlling and high-definition image displaying is used 1 H reversal driving system in which the pixel electrode arranged in even line is driven by the negative voltage potential as a voltage potential of the opposite voltage and the pixel electrode arranged in odd line is driven by the positive voltage potential as a voltage potential of the opposite electrode, while during a display corresponding to an image signal of the subsequent frame or field is implemented, the pixel electrode arranged in odd line is driven by the negative voltage potential and the pixel electrode arranged in even line is driven by the positive voltage potential (the relevant voltage polarity is reversed in a frame or field cycle for each row when the pixel electrode in the same line is driven by the voltage potential of the same polarity). In addition, as the reversal driving system which enables relatively easy controlling and high-definition image displaying is also used 1 S reversal driving system in which the relevant voltage polarity is reversed in a frame or field cycle for each row when the pixel electrode in the same line is driven by the voltage potential of the same polarity. Furthermore, there has been also developed the dot reversal driving system in which the voltage polarity applied to each pixel electrode is reversed between the pixel electrodes adjacent to the line direction and row direction.

This kind of electro-optical device is generally driven in an active matrix by mounting a holding capacitor electrically connected to a TFT and the pixel electrode. This holding capacitor holds the voltage potential applied to the pixel electrode during a fixed period, whereby the voltage potential holding characteristic can be remarkably improved in each pixel. Such holding capacitor often includes a double-layer dielectric film inserted between a pair of electrodes for the sake of securing the capacitor.

In JP-A-2003-347543 is disclosed the technology that reduces the current leakage when low electric field is applied by constituting a silicon nitride film utilized for a part of a nonvolatile memory such as a flash memory which is a type of various semiconductor devices by the layers with different composition ratio of nitrogen and silicon.

However, in case that this kind of electro-optical device is driven in the reversal driving system, the voltage applied to the holding capacitor is not applied to the opposite electrode at uniform polarity constantly, but the voltage of different polarity is applied in correspondence with the reversal driving. More specifically, the voltage potential of one dielectric film out of two dielectric films the holding capacitor has increases or decreases for the other dielectric film. That is, the direction of the electric field on two dielectric films is reversed.

As described above, although the holding capacitor has the strong voltage tolerance to one direction on two dielectric films in case that the direction of the electric field is temporarily reversed, a respectable amount of current leakage occurs in the holding capacitor during the actual use in case that the electric field of reverse direction is applied in correspondence with the reversal driving, whereby there is the technical problem that the direction dependence turns up in the voltage tolerance. The inventor thinks that one factor of the occurrence of current leakage and lowering of voltage tolerance depends on the conventional structure, the film characteristic or the segregation state of various materials on the interface state of the dielectric film that even if the holding capacitor includes two dielectric films, but it is difficult to take a proper action by grasping the cause of the occurrence of current leakage and lowering of voltage tolerance.

Moreover, from the viewpoint of the reduction of current leakage and the securing of capacitor, it is thought that the number of stack layers the holding capacitor has increases, but it is difficult to optimize the electro-optical device individually and concretely in response to the element characteristic that requires the construction of dielectric film or the condition of stack layer so that the current leakage has no effect on the actual use.

In addition, since in JP-A-2003-347543 is disclosed the only technology that reduces the current leakage by differentiating the composition ratio of two silicon nitride films, it is hard to say that more general unit for reducing the current leakage is suggested in respect to the dielectric film and stack layer structure formed by different materials.

SUMMARY

Accordingly, an advantage according to an aspect of the present invention is to provide an electro-optical device such as LCD capable of constraining the lowering of voltage tolerance in addition to reducing the voltage leakage generated in the holding unit at the time of the reversal driving, an electronic apparatus having the same.

To solve the problem, the electro-optical device according to the invention comprises a data line and a scanning line extended to be intersected with each other, a transistor to which a scanning signal is supplied by the scanning line, a pixel electrode to which a image signal is supplied via the transistor by the data line, and a holding capacitor constituted by a first electrode electrically connected to the transistor and the pixel electrode, a second electrode disposed opposite to the first electrode, and a multilayer dielectric film structure disposed between the first electrode and the second electrode, wherein the multilayer dielectric film structure is formed in each of the first electrode and the second electrode viewed from a low dielectric film to be sandwiched between the low dielectric films, and has a first high dielectric film and a second high dielectric film with the permittivity relatively higher than the permittivity of the low dielectric film.

In the electro-optical device according to the invention, an image signal is supplied or stops being supplied to the pixel electrode from the date line in accordance with the ON/OFF switching of the transistor switching-controlled in response to the scanning signal. Herewith, so-called active matrix driving becomes available. In addition, according to the invention, since the holding capacitor consisting of the first electrode, dielectric film and second electrode is formed, whereby for example, the voltage potential characteristic can be remarkably improved in the pixel electrode, the image quality is significantly enhanced. 'The holding capacitor' according to the invention designates a condenser functioning as a memory capable of temporarily storing the voltage potential based on the image signal prior to the application to the pixel electrode in addition to a condenser used for improving the voltage potential holding characteristic in the pixel electrode as described above.

A multilayer structure is formed in three-layer structure consisting of a low dielectric film, and a first high dielectric film and a second high dielectric film formed to be inserted with the low dielectric film. In accordance with the three-layer structure, since the first high dielectric film and the second high dielectric film are formed both sides of the low dielectric film, the multilayer structure shows the structurally symmetrical structure along the low dielectric film.

Accordingly, for example, the high-low relation of the voltage potential of the first electrode and second electrode is changed, whereby although the direction of the electric field is reversed in the multilayer dielectric structure, the current leakage can be reduced at the level having no effect on the actual use by the structural symmetric property of the multilayer dielectric film applied to the multilayer dielectric film structure is temporarily reversed, whereby the voltage tolerance of the multilayer dielectric film structure can be prevented from being deteriorated.

Further, in the multilayer dielectric film structure, since the low dielectric film is inserted between the first high dielectric film and the second dielectric film, the capacity of the holding capacitor can be augmented, as comparing that only one layer of the low dielectric film is provided between the first electrode and the second electrode.

If each permittivity of the first high dielectric film and second high dielectric film is higher than that of the low dielectric film, the permittivity is not restricted, but if it is considered from the electrical characteristic viewpoint in addition to the structural viewpoint, it is desirable that the permittivity of the first high dielectric film and second high dielectric film is the same as each other.

As described above, in the electro-optical device according to the invention, the temporary lowering of the voltage tolerance in operating can restrained as well as the current leakage can be reduced. Herewith, the high-definition electro-optical device with high reliability can be provided.

In the electro-optical device according to embodiment 1 of the invention, the second electrode is sustained at the reference voltage and the second high dielectric film is electrically connected to the second electrode, whereby the voltages with different polarity from the reference voltage potential may be sequentially applied to the pixel electrode via the first electrode.

In this embodiment, 'the reference voltage potential' is the voltage potential sustained, for example, via the voltage potential-fixed capacitor wiring so that the voltage potential of the second electrode becomes the constant potential. The bad alignment of the electro-optical element such as liquid crystal element based by sequentially applying the voltage with different polarity from the reference voltage is reduced, whereby the defect in the image display such as flicker shown on an LCD can be prevented.

In this embodiment, the second high dielectric film is formed on the second electrode, whereby the film thickness may be relatively thick in comparison with the first high dielectric film.

In accordance with this embodiment, while the lowering of the voltage tolerance is restrained taking advantage of the multilayer dielectric film structure while the lowering of the voltage tolerance also can more effectively be constrained experimentally or empirically. Moreover, in accordance with this embodiment, it is possible to adjust the relative film thickness composition ratio to secure the required holding capacitor.

In another embodiment of the electro-optical device according to the invention, the plurality of pixel electrodes is arranged on the substrate in a matrix, whereby the voltage with different polarity may be applied to the pixel line and pixel row of the plurality of pixel electrodes arranged in a matrix, and to every pixel electrode adjacent to both directions of row direction and line direction of the plurality pixel electrodes, or to every group regulated in every field.

In accordance with this embodiment, the deterioration of the voltage tolerance caused by the reverse of electric field direction applied to the holding capacitor can be constrained on the multilayer dielectric film structure in case of 1 H reversal driving performed by applying the voltage with different polarity to every pixel line, 1 S reversal driving performed by applying the voltage with different polarity to every pixel row, a dot reversal driving, or a reversal driving for each group regulated in every field. In this embodiment, if the temporarily reversed driving system is adopted for the electric field out of the holding capacitor at the operation time, it is not confined to the above-reference driving system.

In another embodiment of the electro-optical device according to the invention, each of the first high dielectric film and the second high dielectric film may have the multilayer structure with the plurality of high dielectric film so that the position of the stack layer or film thickness is symmetrical to each of the first high dielectric film and the second high dielectric film view from the low dielectric film.

In another embodiment of the electro-optical device according to the invention, in the multilayer structure, the silicon nitride films of the same number may be stack-formed on both sides of HTO film.

In accordance with this embodiment, since the silicon nitride films of the same number are stacked on both sides view from the HTO film, the voltage-resistant characteristic of the holding capacitor can be improved in the comparison with the case that the silicon nitride films of different number are stacked on each of both sides of the HTO film.

In this embodiment, 'the symmetry' indicates that the first high dielectric film or second high dielectric film has the plurality of high dielectric film from a viewpoint of the structural and electrical characteristic. More specifically, for example, 'the symmetry' represents that the first high dielectric film and second high dielectric film have the multilayer structure in case that the first high dielectric film and second high dielectric film have the high dielectric film of same film thickness in the stack position mutually corresponding toward each of the first electrode and second electrode, in case that they have the high dielectric film of the same permittivity in the mutually corresponding stack position, or in case that they have the high dielectric film of same film thickness and permittivity in the stack position.

In this embodiment, the electrical or structural symmetric property of the first high dielectric film and second high dielectric film is used, whereby even if the reverse polarity of voltage is applied, the voltage tolerance of the holding capacitor can be improved.

To solve the problem, the electronic apparatus according to the invention is equipped with the electro-optical device according to the above-referenced invention.

In the electronic apparatus according to the invention, since the electro-optical is equipped with the electro-optical device according to the above-referenced invention, there are embodied a variety of electronic apparatuses such as a projection display device, a cellular phone, an electronic databook, a word processor, a viewfinder-type or monitor direct-view-type video tape recorder, a workstation, a video phone, a POS terminal, a touch panel, a field emission display or conduction electron-emitter display, a DLP (Digital Light Processing) using the field emission display) using the field emission display, and the like, which can display a high-definition image quality. In addition, as the electronic apparatus according to the invention, an electrophoresis device such as, for example, an electronic paper can be embodied.

BRIEF DESCRIPTION OF THE DRAWINGS

The invention will be described with reference to the accompanying drawings, wherein like numbers reference like elements.

DESCRIPTION OF EXEMPLARY EMBODIMENTS

These operations and other effects will be disclosed from the below-referenced embodiment.

BEST MODE FOR CARRYING OUT THE INVENTION

Hereinafter, the electro-optical device of the embodiment and electronic apparatus having the same are specifically described with reference to the drawings below. Further, in this embodiment, a liquid crystal device which is an aspect of the electro-optical device according to the invention.

1: General Construction of Liquid Crystal Panel

Figure 1:
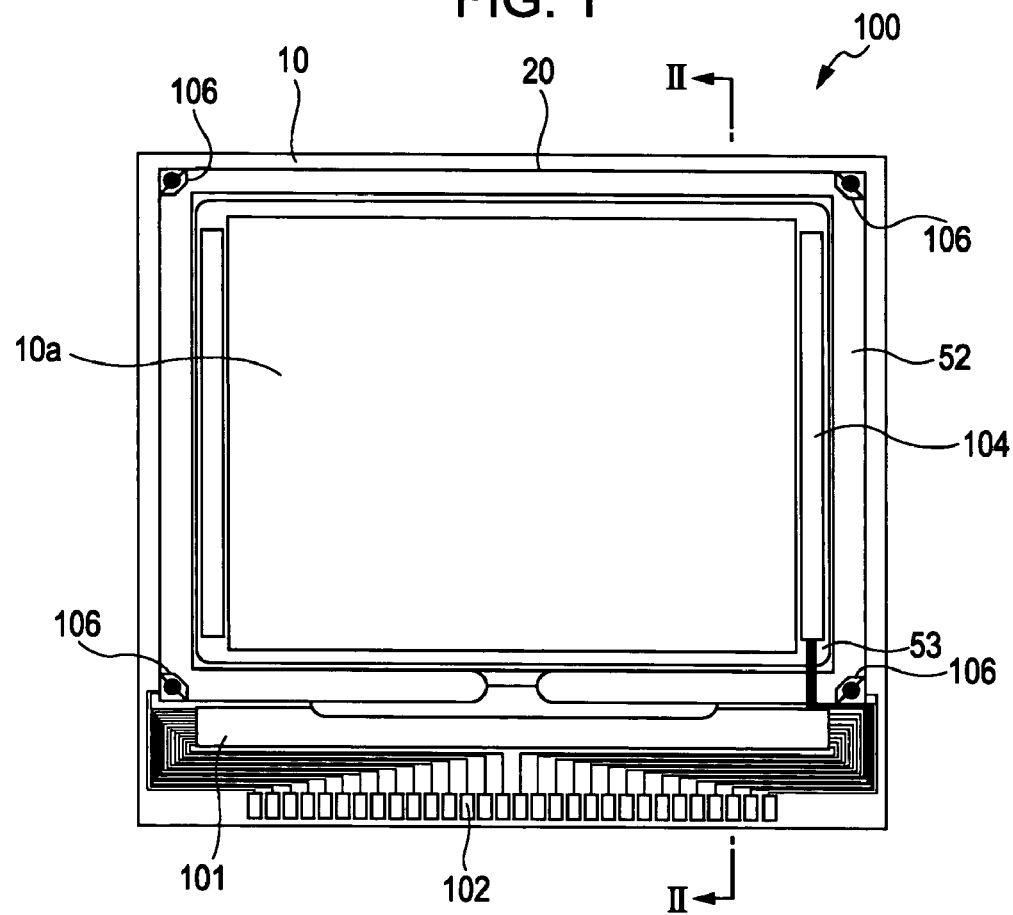
FIG. 1 is a plan view showing the general construction of a liquid crystal panel that a liquid crystal device of this embodiment has.
Figure 2:
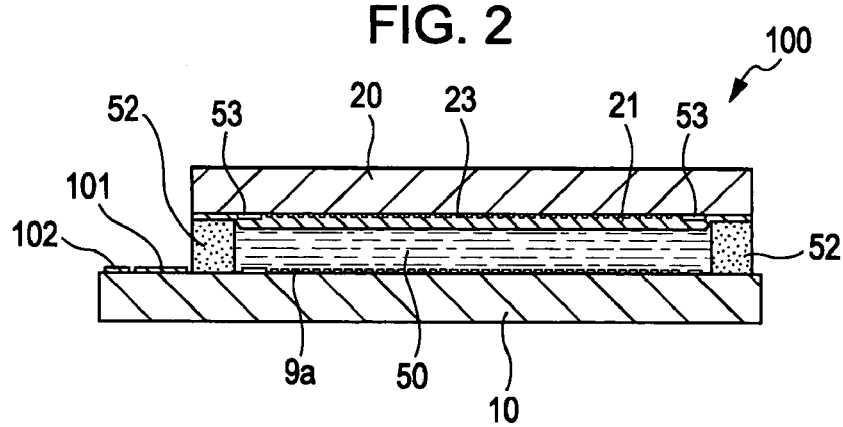
FIG. 2 is an H-H' cross-sectional view of FIG. 1.

First, a specific construction of the liquid crystal panel 100 that a liquid crystal device 1 of this embodiment has is described with reference to FIGS. 1 and 2. FIG. 1 is a schematic plan view of the liquid crystal panel 100 viewing a TFT array substrate 10 and each component formed thereon from a side of an opposite substrate 20, and FIG. 2 is an H-H' cross-sectional view of FIG. 1. In addition, the liquid crystal panel 100 of this embodiment is an aspect of the electronic apparatus according to the invention and the liquid crystal device 1 having the liquid crystal panel 100 adopts the TFT active matrix driving system of driving circuit built-in type.

In accordance with FIGS. 1 and 2, the liquid crystal panel 100 has the opposite substrate 20 arranged opposite to the TFT array substrate 10 and TFT array substrate 10. A liquid crystal layer 50 is inserted between the TFT array substrate and the opposite substrate 20, and the TFT array substrate 10 and opposite substrate 20 are attached to each other via a seal material 52 provided in the range of a seal located on the periphery of an image display region 10a.

The seal material 52, which is made from, for example, ultraviolet light curable resin, thermal curable resin and the like for bonding both substrates, is hardened by the ultraviolet light irradiation and heating after being coated on the TFT array substrate 10 in the manufacturing process. A gap material such as a glass fiber or glass bead to reduce the gap (substrates gap) between the TFT array substrate 10 and the opposite substrate 20 to a predetermined value is dispersed in the seal material 52.

An architrave light shielding film 53 that regulates the architrave region of the image display region 10a parallel to the inside of the seal region in which the seal material 52 is arranged is provided on the opposite substrate 20. However, a part of or the entirety of the architrave light shielding film 53 may be provided on the TFT array substrate 10 as a built-in light shielding film.

Out of peripheral regions located in the periphery of the image display region 10a, a data line driving circuit 101 and a external circuit connection terminal 102 are provided along one side of the TFT array substrate 10. In addition, a scanning line driving circuit 104 is provided along any one of two sides adjacent to one side, being covered by the architrave light shielding film 53. Further, the scanning line driving circuit 104 may be provided along two sides adjacent to one side of the TFT array substrate 10 in which the data line driving circuit 101 and external circuit connection terminal 102 is provided. In this case, two scanning line driving circuits 104 are connected to each other by a plurality of wirings provide along the rest side of the TFT array substrate 10.

An upper and lower conducting material 106 acting as an upper and lower conducting terminal is arranged at four corners of the opposite substrate 20. On the other hand, in the TFT array substrate 10, an upper and lower conducting terminal is provided in the range opposite to the corner portion. The electrical conducting can be obtained between the TFT array substrate 10 and the opposite substrate 20 by the upper and bottom conducting terminal and upper and lower conducting material 106.

In FIG. 2, a TFT for the pixel switching is formed on the TFT array substrate 10 or an alignment film is formed on the pixel electrode 9*a* after the wirings such as the scanning line, data line and the like are formed. On the other hand, a lattice-shaped or a stripe-shaped light shielding film 23 in addition to the opposite electrode 21 is formed on the opposite substrate 20, and in addition, the alignment film is further formed on the top layer part. Further, the liquid crystal layer 50 is made by a liquid crystal mixed with a kind or various kinds of nematic liquid crystal, and shows a predetermined alignment state between a pair of alignment films. In addition, a liquid crystal device 1 may has an examination circuit for examining the quality, defect and the like of the liquid crystal device as well as a sampling circuit or pre-charge circuit in the middle of manufacturing or at the shipment time.

2: Electrical Construction of Liquid Crystal Device

Figure 3:
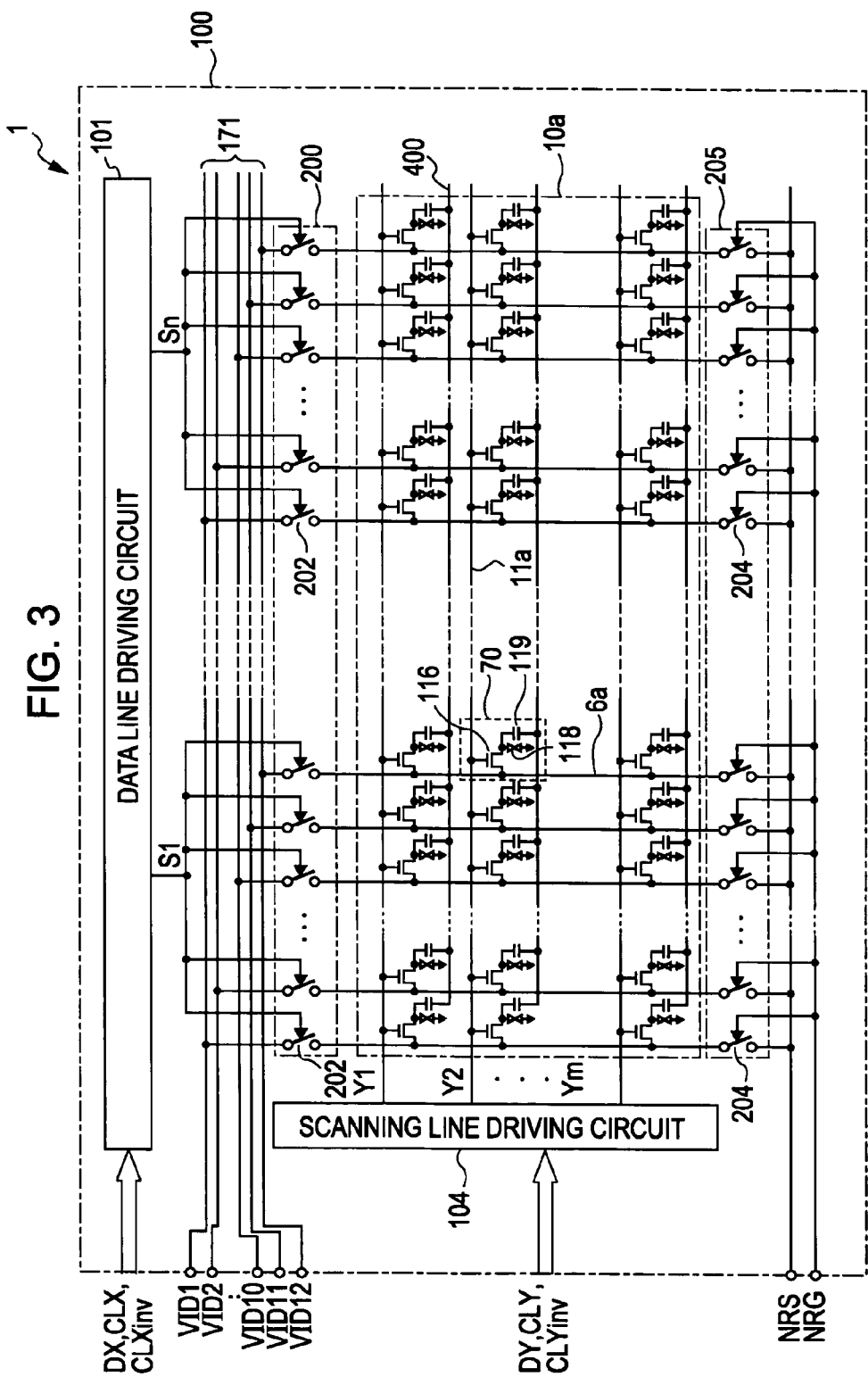
FIG. 3 is a block diagram showing the electrical construction of a liquid crystal device of this embodiment.

In FIG. 3, a liquid crystal device 1 has the liquid crystal panel 100 that includes a scanning line driving circuit 104, a data line driving circuit 101, a sampling circuit 200 and a pre-charge circuit 205 in the periphery of the TFT array substrate 10.

A scanning line driving circuit 104 generates and outputs scanning signals Y1, . . . , Ym sequentially at the timing based on a Y clock signal CLY and a reverse Y clock signal CLYinv if a Y start pulse DY is input. A data line driving circuit 101 generates and outputs sampling signals S1, S2, . . . , Sn sequentially at the timing based on an X clock signal CLX and a reverse X clock signal XCLXinv if an X start pulse DX is input. Each of the scanning driving circuit 104 and data line driving circuit 101 has signal processing unit such as a shift register including the plurality of TFTs formed in the periphery of the image display region 10*a* on the TFT array substrate. The sampling circuit 200 has a plurality of sampling switches 202 provided on every data line. The sampling switch 202, for example, is constituted by two TFTs electrically connected in serial, which are a single-channel-type TFT such as P channel type and N channel type. The pre-charge circuit 205 has the plurality of pre-charge switches 204 constituted by the single-channel-type TFT such as P channel type or N channel type, or the plurality of pre-charge switches 204 constituted by a complementary type TFT.

The liquid crystal 100 has a data line 6*a*, a scanning line 11*a* and a capacitor wiring 400 wired lengthwise and crosswise in an image display region 10*a* occupying the center of the TFT array substrate 10. Pixel portions 70 are provided in a matrix at a position corresponding to an intersection point at which the data line 6*a* and scanning line 11*a* intersection with each other. The pixel portion 70 has a liquid crystal element 118, a pixel electrode 9*a*, a TFT 116 for controlling the switching of the pixel electrode 9*a* and a holding capacitor 119. The capacitor wiring 400 is electrically connected to a constant potential source not shown. The holding capacitor 119 is applied to the liquid crystal element 118 in parallel. The voltage of the pixel electrode 9*a* is held by the holding capacitor 119, for example, for longer time than for the time when a source voltage is applied by a number of three ciphers, whereby the holding characteristic is improved. As the result, high contrast ratio is embodied.

3: Operation Principle of Liquid Crystal Device

Next, the operation principle of a liquid crystal device 1 will be described with reference to FIG. 3. The liquid crystal device 1 is driven in 1 H reverse driving system.

In FIG. 3, in a TFT 116 provided to apply an image signal supplied from a data line 6*a* to a selected pixel, a gate is electrically connected to a scanning line 11*a*, a source is electrically connected to a data line 6*a* and a drain is connected to a pixel electrode 9*a*. In the pixel electrode 9*a*, a liquid crystal capacitor is formed between the same and a below-referenced opposite electrode 21 and an input image signal is applied to a pixel region, thereby being held during a fixed period. One electrode of the holding capacitor 119 is electrically connected to the drain of the TFT 116 in parallel with the pixel electrode 9*a*, whereby one electrode is connected to a capacitor wiring 400 of fixed voltage potential to reach constant potential state.

The liquid crystal device 1, for example, applies the image signals to the data line 6*a* from a data line driving circuit 101 in a row of a selected pixel region in a horizontal direction in which a TFT 119 is on while sequentially applying scanning signals Y1, Y2, . . . , Ym to each scanning line 11*a* from a scanning line driving circuit 104 by means of the TFT active matrix driving system. Then, the image signals may be supplied to each data line 6*a* sequentially. Herewith, the image signals are supplied to the pixel electrode 9*a* of the pixel region. Since a liquid crystal panel 100 is oppositely disposed by inserting a liquid crystal layer 50 between the TFT array substrate 10 and an opposite substrate 20 (See FIG. 2), an electric field is applied to the liquid crystal layer 50 to every pixel region partitioned as shown above and the transmitted light amount between both substrates is controlled on every pixel region, whereby an image is gradated. At that time, the leakages of the image signals held in each pixel region is prevented by the holding capacitor 119.

In this embodiment, since the 1 H driving system is adopted, during the image display period of n-th (however, n is a counting number) field or frame, the voltage with different polarity of reference voltage from that of adjacent row is applied to each line of the pixel electrode 9*a* parallel to a Y axis direction (direction along the data line 6*a* as shown in FIG. 3), whereby the pixel region is driven under the state that the liquid driving voltage of reverse polarity is applied to every line. More specifically, during the image display period of n+1-th field or frame following n-th field, the polarity of the liquid crystal driving voltage is reversed. During an n+2-th field or frame and the followings, the same state as n-th or n+1-th is periodically repeated. As shown above, if the polarity of the voltage applied to the liquid crystal layer 50 is periodically reversed, a direct voltage is prevented to be applied to the liquid crystal, whereby the deterioration of the liquid crystal is constrained. In addition, the polarity of the voltage applied to every line of the pixel electrode 9*a* is reversed, so that a crosstalk or flicker is prevented. Here, the voltage potential of the electrode (i.e. one electrode described above) electrically connected to the capacitor wiring 400 out of a pair of electrodes constituting the holding capacitor 119 is maintained fixed potential, the constant voltage potential of the electrode (i.e. one electrode described above) not electrically connected to the capacitor wiring 400 is periodically reversed by the polarity reverse of applied voltage for the fixed voltage potential. Accordingly, the electric field of the reverse direction in response to the reversal driving is applied to a dielectric film that the holding capacitor 119 has. The holding capacitor 119 of this embodiment prevents the deterioration of the dielectric film caused by the application of the electric field in a reverse direction by regarding the stack layer structure of the dielectric film as specifically described below.

Further, in this embodiment, the 1 H driving is taken as the driving system of the liquid crystal device 1, but a 1 S reversal driving system in which the voltage of reverse polarity is applied to every pixel rows or a dot reversal driving system in which the voltage of reverse polarity is applied to every pixel may be adopted. Even if those driving systems are adopted, in the construction of the below-referenced holding capacitor 119, the deterioration of dielectric film constituting the holding capacitor 119 can be constrained, whereby the current leakage can be reduced in the holding capacitor 119.

4: Concrete Construction of Liquid Crystal Device

Figure 4:
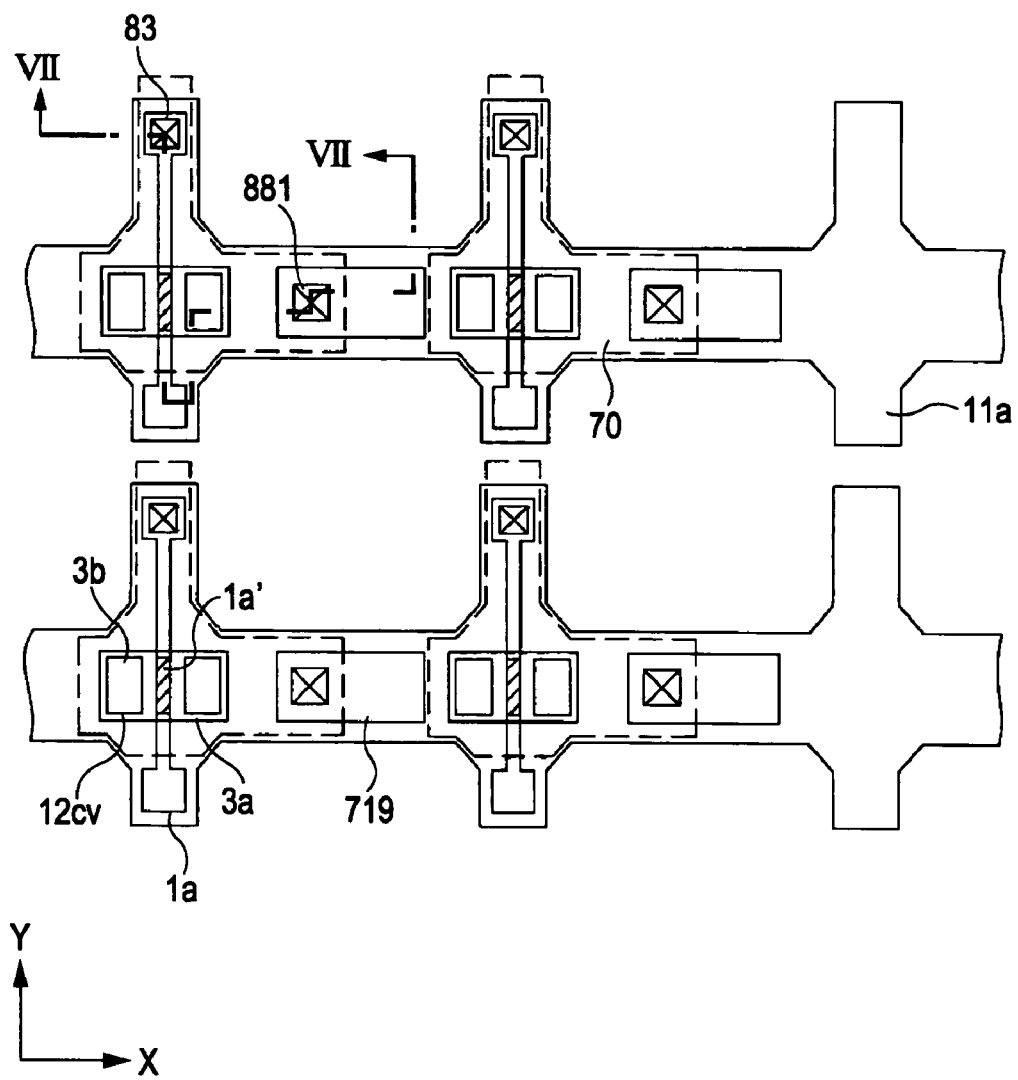
FIG. 4 is a plan view of pixel part group on a TFT array substrate that the liquid crystal device has and shows the only construction related to a lower layer part (a lower layer part up to reference numeral 119 (holding capacitor) shown in FIG. 7)
Figure 5:
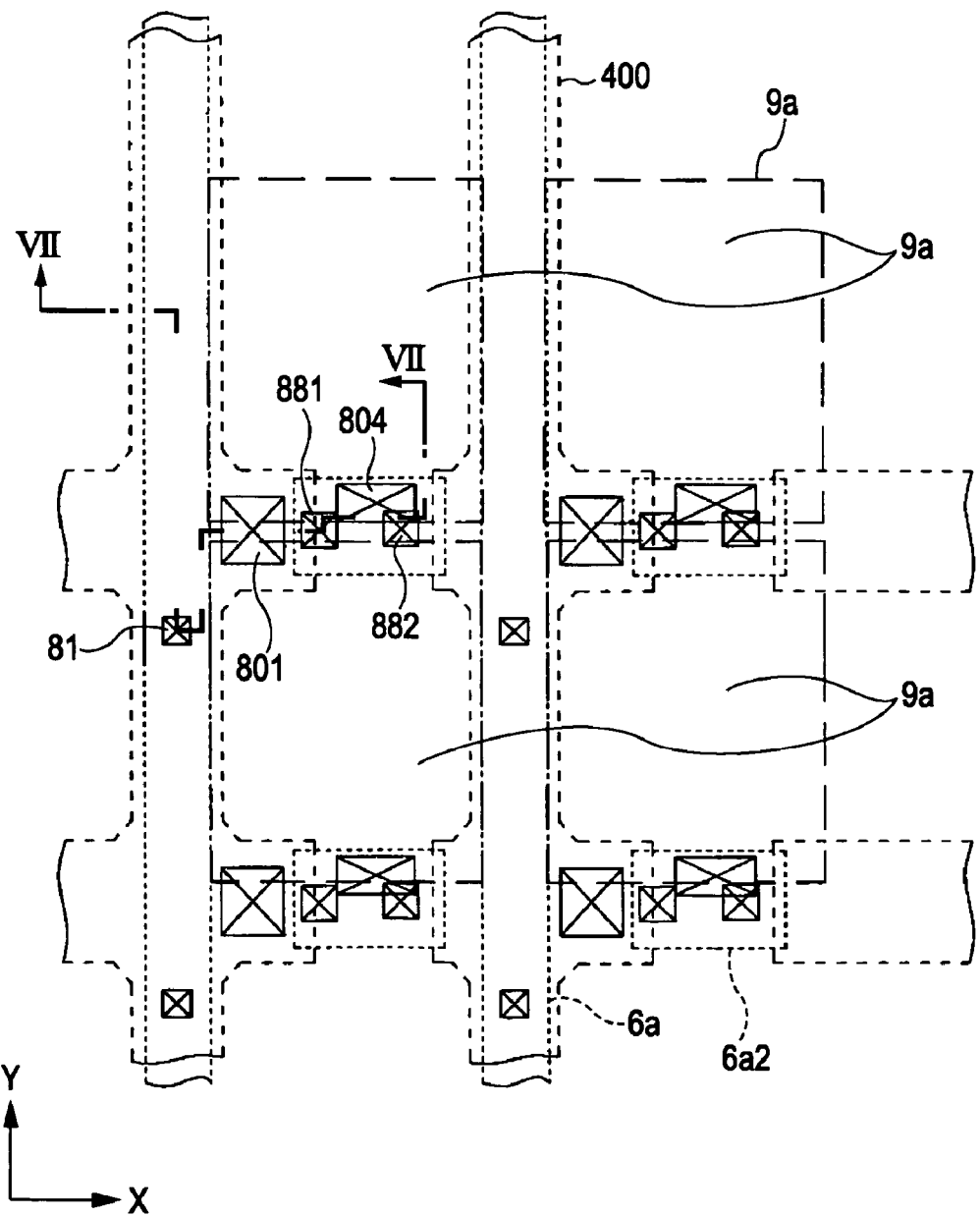
FIG. 5 is a plan view of pixel part group on a TFT array substrate and shows the only construction related to an upper layer part (an upper layer part up to reference numeral 119 (holding capacitor) shown in FIG. 7).
Figure 6:
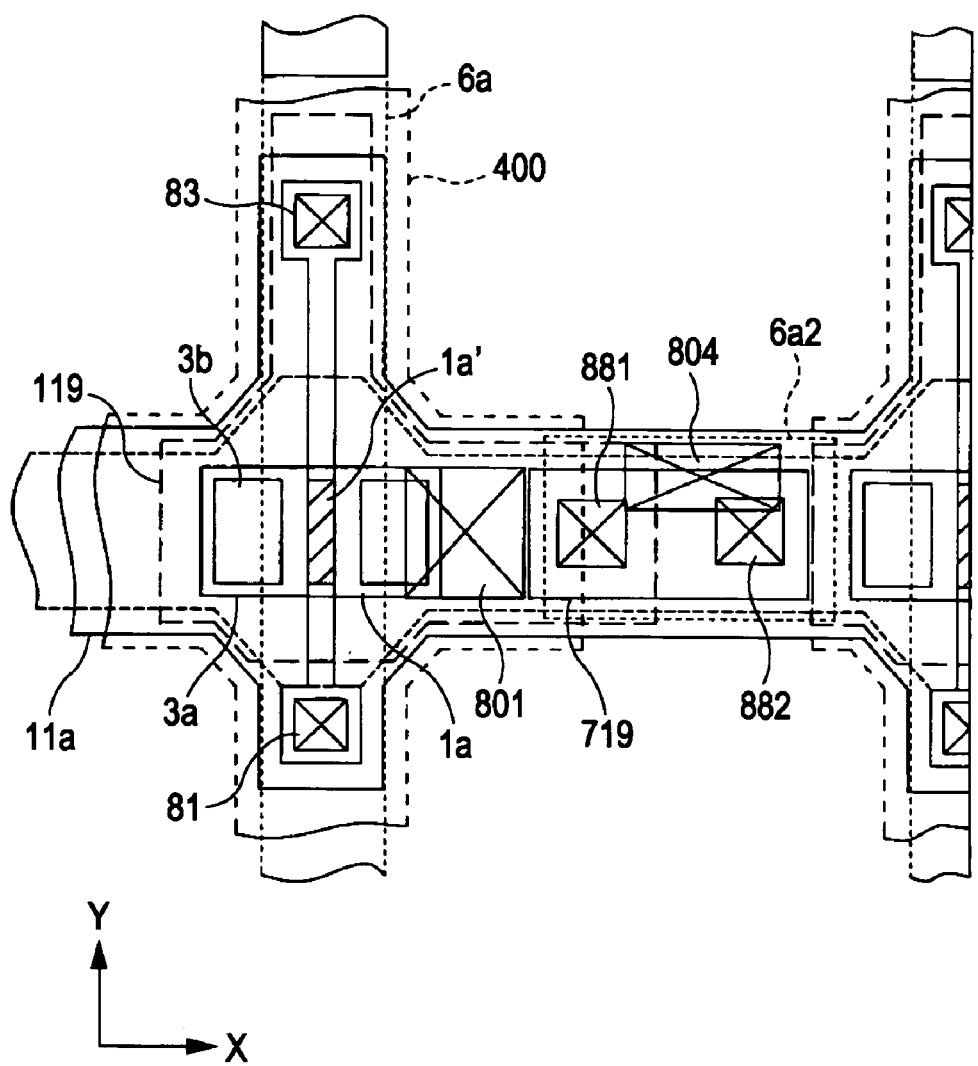
FIG. 6 is a plan view in case of overlaying FIGS. 4 and 5, and a partial enlarged view of FIGS. 4 and 5.
Figure 7:
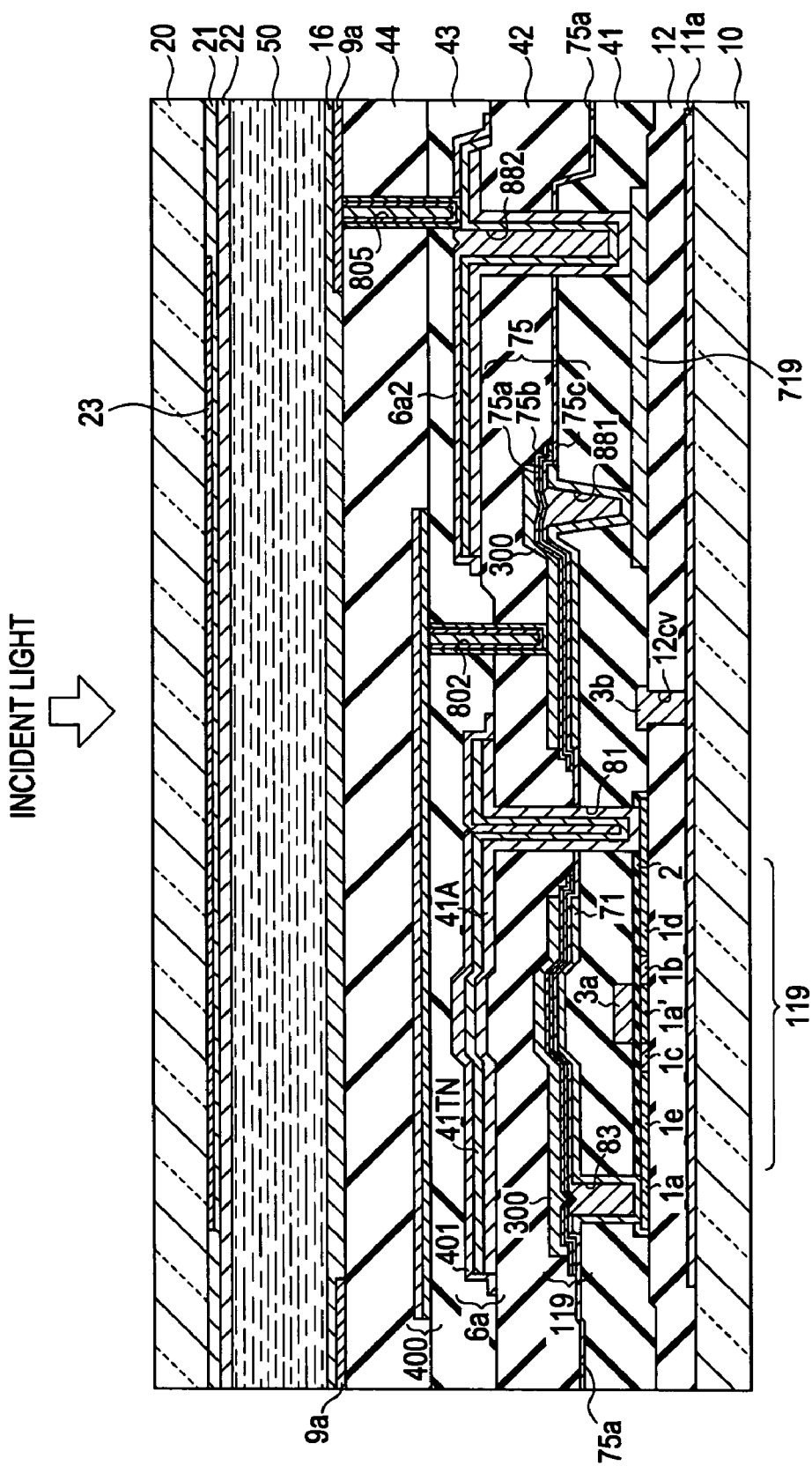
FIG. 7 is a cross-sectional view taken along line A-A' in case of overlaying FIGS. 4 and 5.
Figure 8:
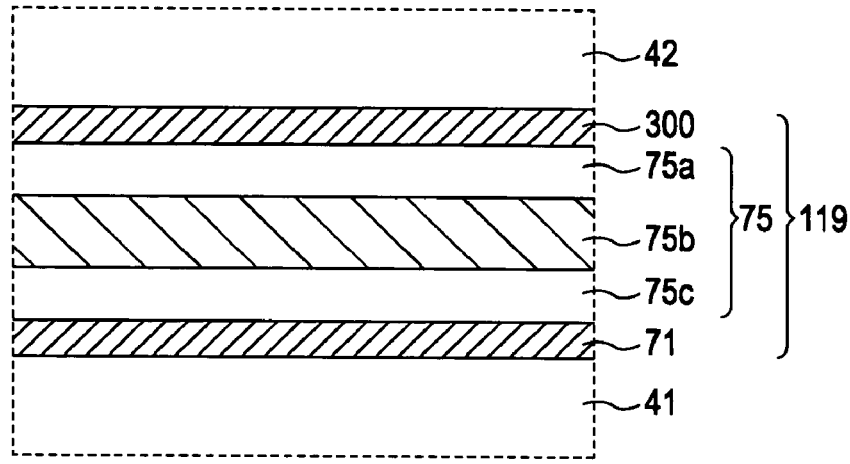
FIG. 8 is a cross-sectional view of a chief part showing the construction of the holding capacitor 119 shown in FIG. 7.

Next, the concrete construction of the liquid crystal device 1 shown in FIG. 3 will be described with reference to FIGS. 4 to 8. In addition, common parts shown in FIGS. 1 to 3 will be described by granting the common reference numerals. FIG. 4 is a plan view of pixel part group on a TFT array substrate 10 that the liquid crystal device 1 has and shows the only construction related to a lower layer part (a lower layer part up to reference numeral 119 (holding capacitor) shown in FIG. 7). FIG. 5 is a plan view of pixel part group on a TFT array substrate 10 and shows the only construction related to an upper layer part (an upper layer part up to reference numeral 119 (holding capacitor) shown in FIG. 7). FIG. 6 is a plan view in case of overlaying FIGS. 4 and 5, and a partial enlarged view of FIGS. 4 and 5. FIG. 7 is a cross-sectional view taken along line A-A' in case of overlaying FIGS. 4 and 5. FIG. 8 is a cross-sectional view of a chief part showing the construction of the holding capacitor 119 shown in FIG. 7.

In FIGS. 4 to 7, each circuit component of the above-referenced pixel portion is constructed on the TFT array substrate 10 as patterned and layer-stacked conducting film. The TFT array substrate 10, for example, includes a glass substrate, a quartz substrate, an SOI substrate, a semiconductor substrate and the like, and is disposed opposite to an opposite substrate 20 consisting of the glass substrate or quartz substrate. Further, each circuit component a first layer including the scanning line 11a, a second layer including a gate electrode 3a, a third layer including a capacitor electrode on a fixed voltage potential side of the holding capacitor 119, a fourth layer including the data line 6a, a fifth layer including the capacitor wiring 400 and a sixth layer including the pixel electrode 9a in order from the bottom. In addition, a base insulating film 12 is provided between the first layer and the second layer, a first interlayer insulating film 41 between the second layer and the third layer, a second interlayer insulating film 42 between the third layer and the fourth layer, a third interlayer insulating film 43 between the fourth layer and the fifth layer, and a fourth interlayer insulating film 44 between the fifth layer and the sixth layer, whereby the above-referenced components are prevented from being shunted. Besides, out of them, the first to third layers are shown as a lower part in FIG. 4 and the fourth to sixth layers are shown as a upper part in FIG. 5. The first layer consisting of the scanning line, etc.

The first layer is constituted by the scanning line 11a. The scanning line 11a is patterned in the shape constructed by a main line extended to an X direction shown in FIG. 4 and a projecting portion extended to a Y direction shown in FIG. 4 in which the data line 6a or the capacitor wiring 400 is serialized. The scanning line 11a, for example, is made from a conductive polysilicon, and in addition, it can be formed by the metal group including at least one of high melting point metals such as titanium (Ti), chrome (Cr), tungsten (W), tantalum (Ta), molybdenum (Mo), etc., alloyed metal, metal silicide, layered body or the like.

The Second Layer Consisting of the TFT, etc.

The second layer is constituted by the TFT 116 and a relay electrode 719. The TFT 116, for example, has an insulating film 2 including a gate electrode 3a, a semiconductor layer 1a, a gate electrode 3a, a gate insulating film for insulating the semiconductor layer 1a as an LDD (Lightly Doped Drain) structure. The gate electrode 3a, for example, is formed by a conductive polysilicon. The semiconductor 1a, for example, is made from a ploysilicon, and constituted by a channel region 1a', a low density source region 1b and a low density drain region 1c, and a high density source region 1d and a high density drain region 1e. In addition, it is desirable that the TFT 116 shows the LDD structure, but it may show the offset structure in which the impure substance is not implanted in the low density source region 1b and low density drain region 1c. Further, the TFT 116 may be in self-alignment type forming the high density source region and high density drain region by implanting the impure substance in high density with the gate electrode 3a as a mask. In addition, the relay electrode 719, for example, is formed by the same film as the gate electrode 3a.

The gate electrode 3a of the TFT 116 is electrically connected to the scanning line 11a via a contact hole 12cv formed on the base insulating film 12. The base insulating film 12 which is, for example, made from a silicon oxide film carries out the interlayer insulating between the first layer and the second layer and is formed on the whole surface of the TFT array substrate 10. Further, the base insulating film 12 functions preventing the change in the element characteristic of the TFT 116 which a roughness or a dirt by grinding the substrate surface outbreaks.

The Third Layer Consisting of the Holding Capacitor, etc.

The third layer is constituted by the holding capacitor 119. The holding capacitor 119 has a capacitor electrode 300 constituting an aspect of 'the second electrode' according to the invention, a lower electrode 71 constituting an aspect of 'the first electrode' according to the invention, and a multilayer dielectric structure 75 inserted between the capacitor electrode 300 and the lower electrode 71. Out of them, the capacitor electrode 300 is electrically connected to the capacitor wiring 400. The lower electrode 71 is electrically connected to each of a high density drain region 1e and a pixel electrode 9a of the TFT 116.

The high density drain region 1e is electrically connected to the lower electrode 71 via a contact hole 83 passing through the first interlayer insulating film 41. Further, the pixel electrode 9a is electrically connected to the lower electrode 71 along the path constructed by relaying each layer of the relay electrode 719 and a second relay electrode 6a2 via contact holes 881, 882 and 804.

The capacitor electrode 300, for example, is made from the metal group including at least one of high melting point metals such as Ti, Cr, W, Ta, Mo, etc., alloyed metal, metal silicide, polysilicide, material stack-layering them or optimal tungsten silicide. Herewith, the capacitor electrode functions shielding light incident from the upper part to the TFT 116. In addition, for example, a conductive polysilicon is sued for the lower electrode 71.

Here, in FIG. 8, the multilayer dielectric structure 75 shows a three-layer structure having an HTO (High Temperature Oxide) film 75b as an aspect of 'a low dielectric film' according to the invention, a silicon nitride film 75c as an aspect of 'a first high dielectric film' according to the invention and a silicon nitride film 75a as an aspect of 'a second dielectric film'. The silicon nitride film 75c, HTO film 75b and silicon nitride 75a are sequentially stack-layered from the lower electrode 71, so that the silicon nitride films 75a and 75c has permittivity than relatively higher that of the HTO film 75b.

In the multilayer dielectric structure 75, since the silicon nitride film 75c and silicon nitride 75a are formed on both sides along the HTO film 75b, there is shown the layer-stack structure symmetrical to the upward-and-downward direction shown in FIG. 8 along the HTO film 75b.

Accordingly, when the liquid crystal device 1 is driven in the 1 H reverse, even if the polarity of the voltage potential on the lower electrode 71 is reversed in the capacitor electrode 300 with a fixed voltage potential, whereby the direction of the electric field of the multilayer dielectric film structure is reversed, the current leakage can be reduced to the level having no effect on the actual use by the structural and electrical symmetry of the multilayer dielectric film structure 75. Moreover, the direction of the electric field applied to the multilayer dielectric film structure 75 is temporarily reversed, whereby the voltage tolerance of the multilayer dielectric film structure 75 can be prevented from being deteriorated.

In the multilayer dielectric film structure 75, since the HTO film 75b is inserted between the silicon nitrides 75c and 75a, it is possible to augment the capacity of the holding capacitor 119, comparing the case that any one layer of the HTO film 75b is provided between the capacitor electrode 300 and the lower electrode 71, so that the holding capacity for holding the image signal in each pixel for a fixed time can be elevated.

Furthermore, in this embodiment, each silicon nitride film is formed on both sides along the HTO film 75b, but the silicon nitride films of the same number may be stack-layered on both sides of the HTO film. Herewith, the stack-layer structure is symmetrical along the HTO film, whereby the voltage-resistant characteristic can be effectively improved.

In addition, if the dielectric film provided between the silicon nitride films 75c and 75 with the same permittivity has the permittivity lower than the silicon nitride films, the oxide silicon film such as an LTO (Low Temperature Oxide) may be used instead of, for example, the HTO film 75b. Further, it is preferable that the dielectric films formed on both sides of the low dielectric film has the same permittivity like the silicon nitride films 75a and 75c in this embodiment in consideration of the stack-layer structure and electrical characteristic.

Even if the silicon nitride films 75a and 75c have the same film thickness in the controllable range on the manufacturing process, when the silicon nitride film 75a is thicker than the silicon nitride film 75c, the lowering of the voltage tolerance of the holding capacitor 119 can be effectively constrained experimentally or empirically.

As shown above, a multilayer film structure of three layers is established as the part that acts as a dielectric body kicked between the electrodes of the holding capacitor 119, whereby the image can be displayed in high definition for a long time.

Referring back to FIG. 7, the first interlayer insulating film 41, for example, is formed by NSG (Non-silicate Glass). Besides, silicate glasses such as a PSG (Phosphor Silicate Glass), a BSG (Boron Silicate Glass), a (Boron-Phosphor Silicate Glass), etc., the nitride silicon, the oxide silicon or the like can be used for the first interlayer insulating film 41.

In addition, since this holding capacitor 119 is formed not to reach the pixel path region substantially corresponding to the forming region of the pixel electrode 9a (to be settled within a non-path region) as shown in the plan view of FIG. 4, the pixel aperture ratio is maintained in a relatively large value.

The Fourth Layer Consisting of the Data Line, etc.

The fourth layer is constituted by the data line 6a. The data line 6a is formed by three-layer film including aluminum, nitride titanium and nitride silicon in order from the bottom. The nitride silicon layer is patterned in a bit large size to cover the aluminum layer and nitride titanium on the lower layer. In addition, the second relay electrode 6a2 as the same film as the data line 6a is formed on the fourth layer. As shown in FIG. 5, they are formed to be divided, respectively.

Of them, the data line 6a is electrically connected to the high density source region 1d of the TFT 116 via the contact hole 81 passing through the first interlayer insulating film 41 and the second interlayer insulating film 42. In addition, the second relay electrode 6a2 is electrically connected to the relay electrode 719 via the contact hole 882 passing through the first interlayer insulating film 41 and the second interlayer insulating film 42 as described above. The second interlayer insulating film 42, for example, may be formed by silicate glass such as NSG, PSG, BSG AND BPSG, etc., nitride silicon, oxide silicon or the like.

The Fifth Layer Consisting of the Capacitor Wiring, etc.

The fifth layer is constituted by the capacitor wiring 400. Since the capacitor wiring 400 functions the electromagnetic shielding of the pixel electrode 9a from the wiring such as the data line 6a, etc. on the lower part, the capacitor wiring 400 is provided in and up to the vicinity of the image display region 10a, and is electrically connected to the constant potential source, being a constant potential to cover the data line 6a, scanning line 11a, a TFT 116 and the like in the lower part thereof. In addition, the capacitor wiring 400 is formed in the wider range than the structure of the circuit components. As the result, in each circuit component, light is shield and incident light is reflected to prevent an adverse effect that the contour of the pixel becomes blurry in the projection image. Further, the capacitor wiring 400, for example, shows the two-layer structure stacking aluminum, nitride titanium, etc.

Furthermore, an angle intersecting the X-direction extending part and Y-direction extending part of the capacitor wiring 400 shows the shape substantially as a covering portion is protruded. In this covering portion, the semiconductor layer 1a of the TFT 116 can be effectively shielded. That is, if the covering portion reflects or absorbs light obliquely radiated to the semiconductor layer 1a, the occurrence of light leakage current is prevented in the TFT 116 to display the high-definition image without a flicker.

The capacitor wiring 400 is electrically connected to the capacitor electrode 300 of the holding capacitor 119 via the contact hole 801 subsequently passing through the third interlayer insulating film 43 and second interlayer insulating film 42. Since the capacitor wiring 400 is embedded within the contact hole 801, the bottom surface and sidewall surface thereof reflect and absorb light. In addition, as shown in FIG. 6, the contact holes 801 is in parallel with the TFT 116 toward the extending direction (i.e. the X direction shown in FIG. 6) of non-aperture region and then, they are disposed to be partly overlapped with each other in one end thereof. Further, the hole diameter is large and the width in the widthwise direction of the non-aperture region is the same or larger than that of the TFT 116. Furthermore, since the bottom surface thereof is positioned on the third layer, the contact hole 801 comes close to the semiconductor layer 1a rather than other light shielding layer such as the capacitor wiring 400. Accordingly, the TFT 116, particularly, the semiconductor layer 1a can be more securely shielded.

That is, the sidewall surface of the contact hole 801 acts as the partition with the height from the interlayer insulating film 42 to the interlayer insulating layer 43, whereby light obliquely radiated to the TFT 116 can be well blocked. In addition, the broad bottom surface can well shield the TFT 116.

Meanwhile, since it is thought that it is relatively difficult to etch the depth from the third interlayer insulating film 43 to the second interlayer insulating film 42, a relay layer is generally provided on the second interlayer insulating film 42 to connect the contact holes formed each interlayer insulating film in a direction perpendicular to a layer surface by such relay layer. However, if the pitch of the pixel portion is narrowed, the size of the forming region is issued rather than the depth of the contact hole. That is, each contact holes are not overlapped and formed in one section from a plan view (for example, see the contact holes 882, 804 and 89 shown in FIGS. 6 and 7), they are provided at the position mismatched with each other. Accordingly, since a margin region needs to be secured in the vicinity of each contact hole, the whole contact hole forming region is larger and larger. As shown in FIG. 7, though the contact hole that connects the storage electrode 300 to the capacitor wiring 400 needs to be provided to pass through the gap between the data line 6a and the second relay electrode 6a2, if the existing gap is narrowed by the pitch narrowing, it is difficult to form the contact hole of the structure.

Herewith, in this embodiment, the storage electrode 300 is connected to the capacitor wiring 400 via the only contact hole 801. The forming of the contact hole 801 is larger than other contact holes, but the same or smaller than them in the conventional structure.

In addition, in the above-referenced structure, in case that light is leaked to the TFT 116 from via the gap between the contacts, the light leakage current may be caused. Herewith, in this embodiment, as shown in FIG. 7, the contact hole 801 blocks light radiated obliquely to prevent the light leakage to the TFT 116.

Moreover, here, the aspect ratio of the contact hole 801, that is, the rate of width and depth is set to 1 or less. Generally, if the contact hole is deep (that is, in case that the aspect ratio is more than 1) and the internal wiring is formed in the sputter method, the coverage is lowered in the inside of the contact hole, whereby a discontinuous part may occur. In the mean time, since the contact hole 801 is large in hole diameter, the poor connection may occur, thereby forming the aperture itself easier than in case that the contact hole 801 is small in hole diameter.

Under the fifth layer, the third interlayer insulating film 43 is formed on the whole surface. The third interlayer insulating film 43, for example, can be formed by silicate glass such as NSG, PSG, BSG AND BPSG, etc., nitride silicon, oxide silicon or the like. The sixth layer consisting of the pixel electrode, etc.

The fourth interlayer insulating film 44 is formed on the whole surface of the fifth layer and the pixel electrode 9a is further formed thereon as the sixth layer. The fourth interlayer insulating film 44, for example, can be formed by silicate glass such as NSG, PSG, BSG AND BPSG, etc., nitride silicon, oxide silicon or the like.

In addition, since the fourth interlayer insulating film 44 is formed on the contact hole 801 with large diameter, the surface just after the formation thereof is dented immediately above the contact hole 801. Meanwhile, in this embodiment, the fourth interlayer insulating film 44 is thickly formed in advance to further perform a CMP processing on the surface thereof. In the CMP process, liquid slurry (chemical electropolishing solution) including silica particles onto a polishing pad fixed, for example, on the polishing pad, rotates and contacts the substrate surface, and polishes the surface thereof chemically and mechanically. Besides, the planarizing process includes the mechanical polishing process. By this process, the surface of the fourth interlayer insulating film 44 is planarized, whereby the trouble of the liquid crystal alignment can be prevented in the liquid crystal layer 50 to display the high-definition image.

The pixel electrode 9a (a dash line 9a' is represented as the contour in FIG. 5) is disposed in each of the pixel regions distributively arranged lengthwise and crosswise, the data line 6a and scanning line 11a are formed to be arranged on the bound in a lattice shaped (See FIGS. 4 and 5). Further, the pixel electrode 9a, for example, is made from the transparent conducting film such as an ITO (Indium Tin Oxide), etc.

The pixel electrode 9a is electrically connected to the second relay electrode 6a2 via the contact hole 804 subsequently passing through the interlayer insulating layers 44 and 43 (See FIGS. 4 and 5). Consequently, the forming region of the contact hole 804 is larger than other contact holes, but is the same or smaller than that in the structure that the contact hole formed in the interlayer insulating films 44 and 43 is connected perpendicular to the layer surface via the relay electrode. Therefore, the pitch narrowing can be prevented in the electro-optical device.

Further, since the contact hole 804 is extended in the extending direction (i.e. the X direction shown in FIG. 6) of non-aperture region so as to evade other contact holes even within the non-aperture region, the hole diameter is formed as largely as possible within a limited region. As the result, the coverage of the pixel electrode 9a formed in the inside of the contact hole 804, whereby the occurrence of the poor connection can be prevented. In addition, when comparing the case that the hole diameter is small, a deep hole can be formed with relative ease. Moreover, the alignment film 16 is formed on the pixel electrode 9a. The construction of the pixel portion on the TFT array substrate 10 has been described as above.

On the other hand, an opposite electrode 21 is provided on the whole surface of the opposite surface in an opposite substrate 20 and in addition, an opposite film 22 is further provided (in the part below the opposite electrode 21 in FIG. 6). The opposite electrode 21 is constituted by, for example, a transparent conductive film such as an ITO, etc. like the pixel electrode 9a. In addition, the light shielding film 23 is provided between the opposite substrate 20 and the opposite electrode 21 to cover the region facing the TFT 116 for the prevention of the occurrence of light leakage current.

As shown above, the liquid crystal layer 50 is provided between the TFT array substrate 10 and the opposite substrate 20. The liquid crystal layer 50 is formed by filling the liquid crystal into the space formed by sealing the periphery of the substrates 10 and 20 with the sealing material. Under the state that the electric field is not applied between the pixel electrode 9a and the opposite electrode 21, the liquid crystal layer 50 shows a predetermined alignment shape by the alignment films 16 and 22 to which the alignment process such as rubbing process is applied.

The construction of the pixel portion of the liquid crystal device 1 described above is common to each pixel portion a shown in FIGS. 4 and 5. Such pixel portion is periodically formed in the above-referenced image display region 10a. In the meantime, in this electro-optical device, the driving circuits such as the scanning line driving circuit 104 and data line driving circuit 101 are formed in the peripheral region located in the vicinity of the image display region 10a.

5: Evaluating the Voltage Tolerance of Holding Capacitor

Figure 9:
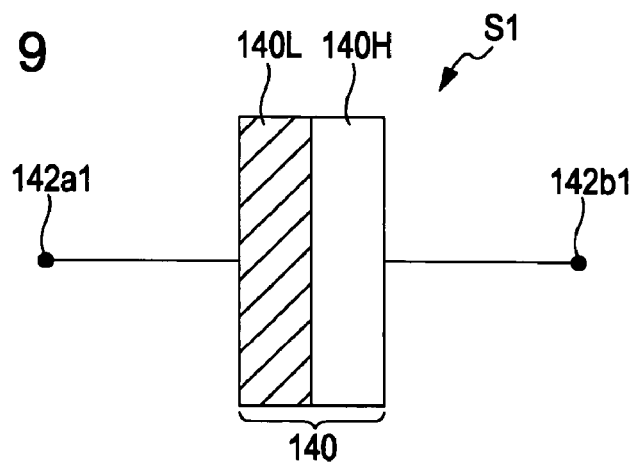
FIG. 9 is a pattern diagram showing the electrical construction of a sample S1 (comparative example) of which multi-layer dielectric structure shows the two-layer structure.
Figure 10:
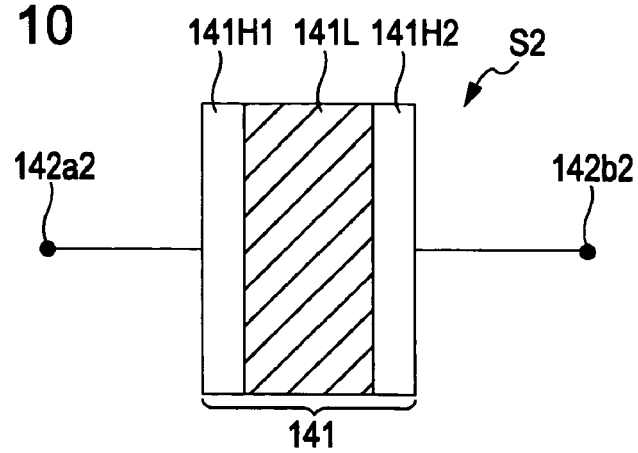
FIG. 10 is a pattern diagram showing the electrical construction of a sample S2 (corresponding to the construction of the holding capacitor in this embodiment) of which multi-layer dielectric structure shows the three-layer structure.
Figure 11:
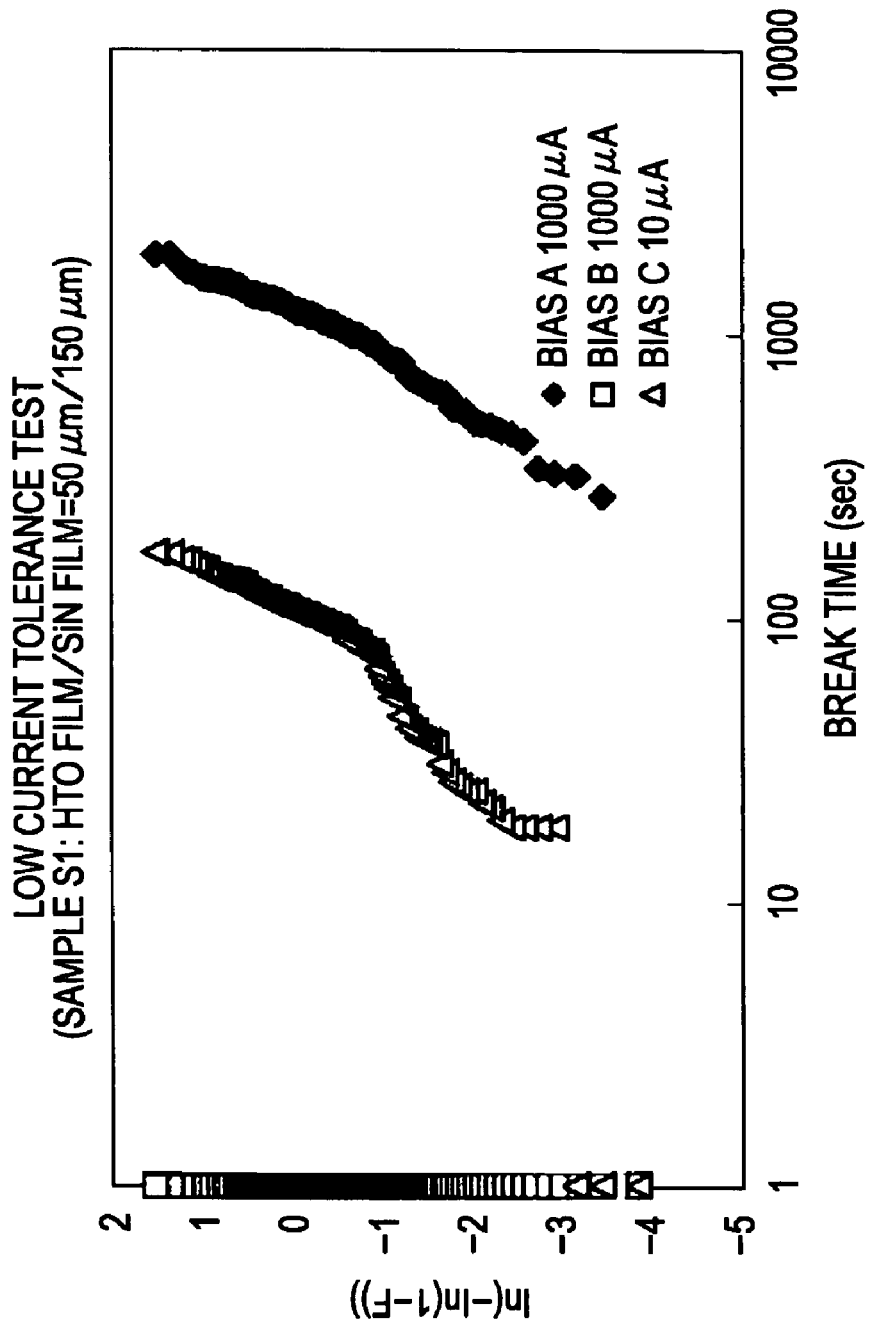
FIG. 11 is a Weibull plot showing the cumulative failure rate of the sample S1 shown in FIG. 9.
Figure 12:
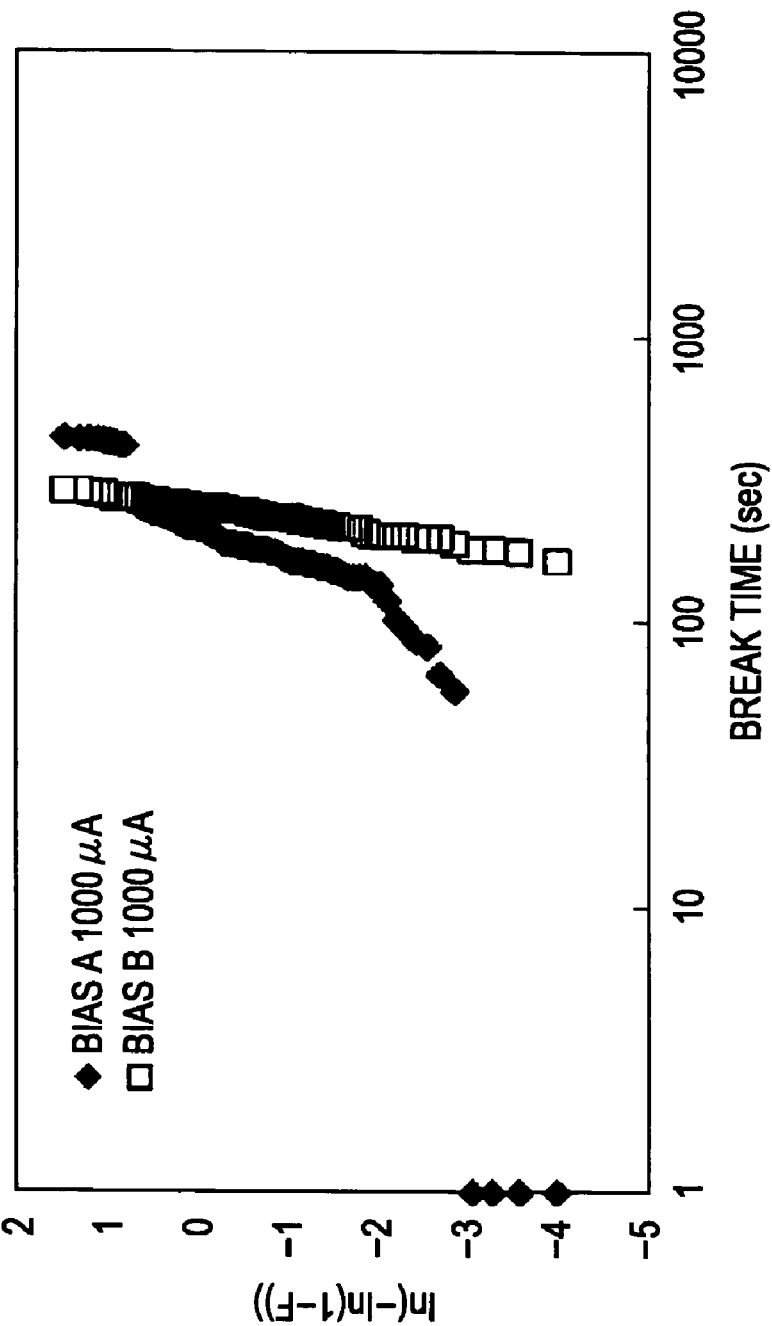
FIG. 12 is a Weibull plot showing the cumulative failure rate of the sample S2 shown in FIG. 10.

Next, the result evaluating the voltage tolerance of the above-referenced holding capacitor will be described with reference to FIGS. 9 to 12. How high the voltage tolerance of the holding capacitor 70 is improved is compared in both cases of the case that the multilayer dielectric structure shows the three-layer structure and the case that the multilayer dielectric structure shows the two-layer structure in FIGS. 9 to 12 as described above. FIG. 9 is a pattern diagram showing the electrical construction of a sample S1 (comparative example) of which multilayer dielectric structure shows the two-layer structure and FIG. 11 is a Weibull plot showing the cumulative failure rate of the sample S1 shown in FIG. 9. FIG. 10 is a pattern diagram showing the electrical construction of a sample S2 (corresponding to the construction of the holding capacitor in this embodiment) of which multilayer dielectric structure shows the three-layer structure and FIG. 12 is a Weibull plot showing the cumulative failure rate of the sample S2 shown in FIG. 10. Further, in this evaluation is implemented under the state that a constant current flows a sample.

In addition, in FIGS. 10 and 12, there is represented 'ln(−ln(1−F(t)))' in which a horizontal axis is set to time t and a longitudinal axis is set to failure distribution function (or unreliability function) F(t). Here, the function F(t) is the failure distribution function of the Weibull distribution and is represented as $F(t)=1-[\exp\{-(t-\gamma)/\eta\}^m]$ (however, m indicates a geometry parameter, γ indicates a scale parameter and η indicates a position parameter). Formula 'ln(−ln(1−F(t)))' related to the horizontal axis is calculated by γ=0, proper transposition and twice acquisition of logarithm for schema F(t). Further, in FIGS. 11 and 12, a bias A means the state setting the voltage potential of each polarity so that the electric field moves from the electrode $42a1$ to the electrode $42b1$ in FIG. 9 and from the $42a2$ to $42b2$ in FIG. 10. A bias B means the state setting the voltage potential of each polarity so that the electric field moves in a reverse direction to the direction of the electric field of the bias A.

As shown in FIG. 9, in the sample S1, the multilayer dielectric structure 140 constituted by HTO film 140 L and silicon nitride film 140 H is electrically connected between the electrodes $142a1$ and $142b1$. Here, the film thickness of the HTO film 140 L is 50 μm and the film thickness of the silicon nitride film 140 H is 150 μm. As shown in FIG. 11, in the sample S2, the multilayer dielectric structure 141 with three-layer structure constituted by HTO film 141 L and silicon nitride film 141 H is electrically connected between the electrodes $142a2$ and $142b2$. Here, the film thickness of the HTO film 141 L is 140 μm and the film thickness of the silicon nitride film 141 H is 30 μm.

As shown in FIG. 11, in the case of Sample S1, it was proved that time of voltage breakdown of Sample S1 is extremely shortened under the bias B in comparison with the case of applying the bias A to Sample S1 such that a current of 1000 μA passes through Sample S1. Further, it is proved that also in the case of weakening the bias B such that a current of 1000 μA to 10 μA passes through Sample S1, time of voltage breakdown of Sample S1 is shortened more compared with the case of applying the bias A to the same.

On the other hand, as shown in FIG. 12, in Sample S2, time of voltage breakdown of Sample S2 hardly varied in both the case of applying a bias A and the case of applying a bias B. In addition, since the inclination of the Weibull plot in FIG. 12 is steeper than that of the Weibull plot shown in FIG. 11, it is supposed that Sample S2 breaks down the voltage in the same breakdown mode. Therefore, Sample S2 is more preferable as a voltage breakdown mode than is Sample S1.

As described above, it was experimentally verified that the tolerance of holding capacitor is improved when an inversion drive is carried out with 1 H by sandwiching a low dielectric layer with high dielectric layers having a higher permittivity than it to arrange a multilayer dielectric structure which the holding capacitor has. Therefore, in the present embodiment, the multilayer dielectric structure 75 of the holding capacitor 119 has a tri-layer structure, thus improving the voltage tolerance of the holding capacitor 119. Accordingly, the holding capacitor 119 can fully deliver performance as originally expected, i.e., the improvement of the potential holding property of the holding capacitor 119, thus enabling the display of images with high quality.

Meanwhile, an absolute value of the voltage tolerance when a reverse electric field is applied to the holding capacitor can be raised by concretely deciding a film thickness ratio of a silicon nitride film to an HTO film. Further, in the case of applying the multilayer dielectric structure same as Sample S2, which is an object for the evaluation in the present embodiment, to the holding capacitor, the film thickness of a silicon nitride film $75a$ in contact with a capacitor electrode 300 in the multilayer dielectric structure 75 can be set at 20 to 80 μm. More desirably, the film thickness of the silicon nitride film $75a$ is set to be thicker than that of the HTO film $75b$ so that the voltage tolerance of the holding capacitor 119 can be improved.

6: Modifications

Figure 13:
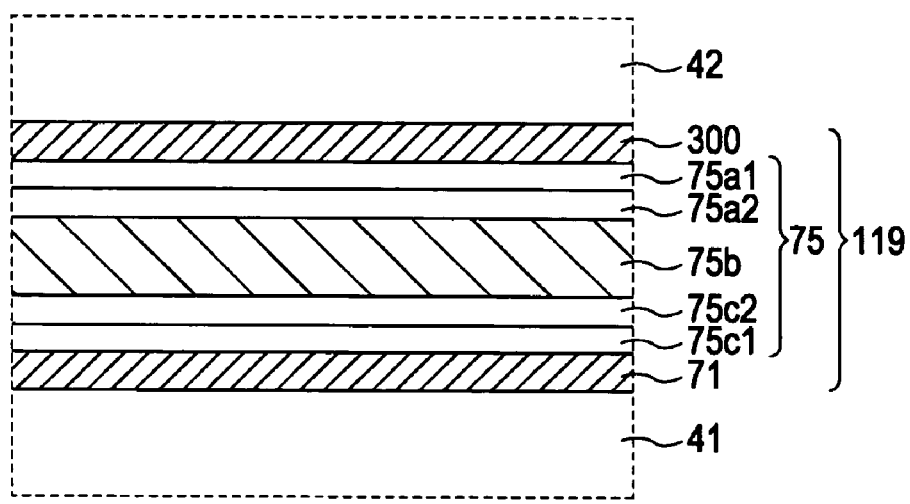
FIG. 13 is a cross-sectional view showing the construction of a modified example of the holding capacitor 119.

Hereinafter, modifications of the holding capacitor 119 included in the liquid crystal device 1 of the present embodiment will be described. FIG. 13 is a cross-sectional view showing the construction of a modified example of the holding capacitor 119.

In FIG. 13, the multilayer dielectric structure 75 included in the holding capacitor 119 has a five-layer structure and includes silicon nitride films $75a1$ and $75a2$, and silicon nitride films $75c1$ and $75c2$, each pair of the films being provided symmetrically at each side of the HTO film $75b$. More specifically, silicon nitride films $75a2$ and $75c2$ each having a thickness equal to one another are formed in corresponding stack-layer positions of both sides of the HTO film $75b$, and silicon nitride films $75a1$ and $75c1$ are formed in corresponding stack-layer positions of both sides of the HTO film $75b$. Accordingly, the multilayer dielectric structure 75 has a structure structurally and electrically symmetrical to each of the capacitor electrode 300 and the lower electrode 71 with respect to the HTO film $75b$. With thus arranged multilayer dielectric structure 75, similarly to the above described multilayer dielectric film structure including the tri-layer structure, the holding capacitor 119 also can improve its voltage tolerance.

Although, in the present embodiment, a five layer structure is cited as a multilayer dielectric film structure, the multilayer dielectric film layer of the present embodiment can improve the voltage tolerance of the holding capacitor 119 appropriately only if the same number of silicon nitride layers are stack-layered in both the sides of the HTO film $75b$ which is an example of a low dielectric film. For example, the multilayer dielectric layer structure 75 may have a seven-layer structure, a nine-layer structure or a structure in which any more odd number of dielectric films are stack-layered.

7: Electronic Apparatus

Figure 14:
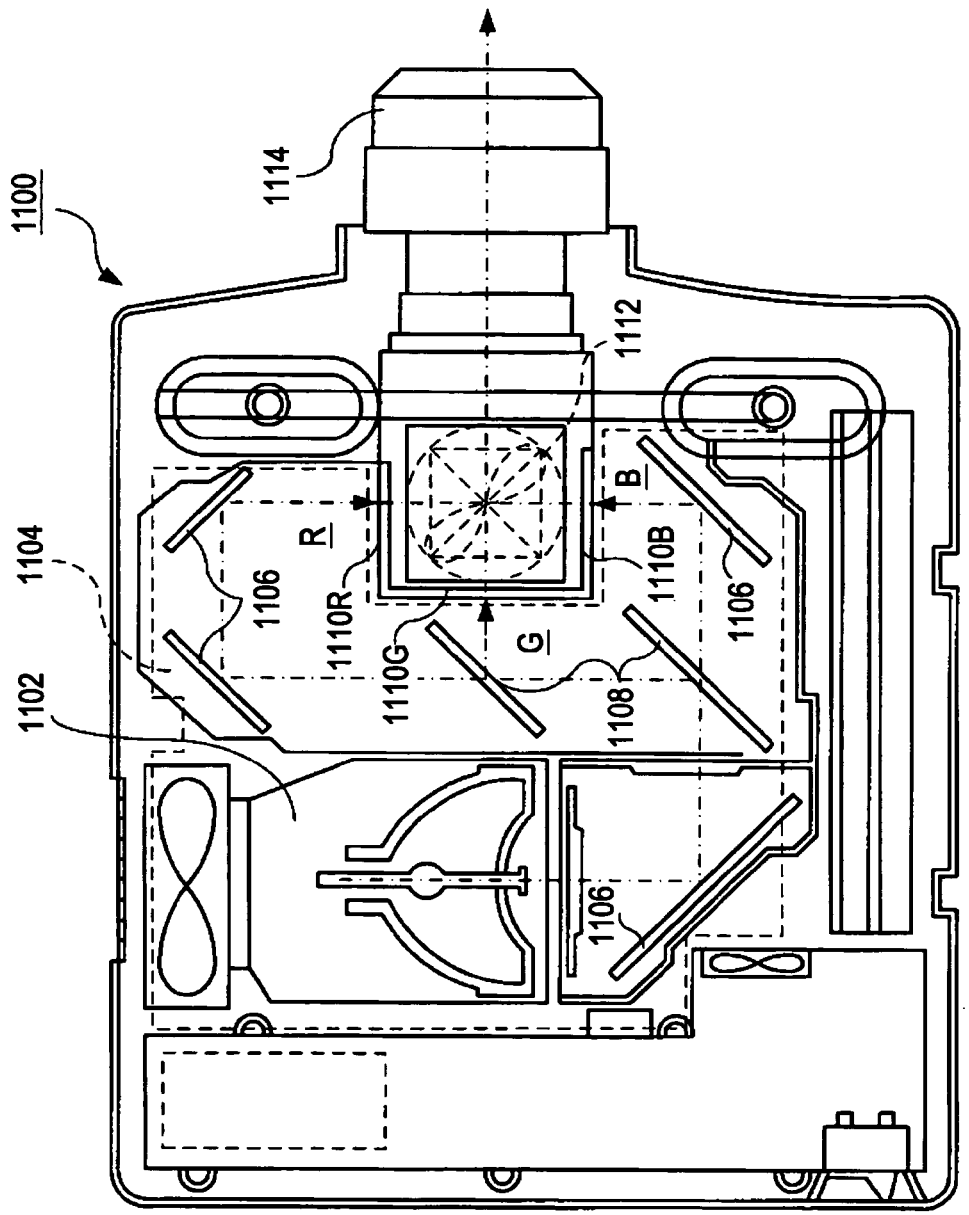
FIG. 14 is a cross-sectional view showing a construction of the projector which is an aspect of an electronic apparatus applying an electro-optical device in accordance with the invention.
Figure 15:
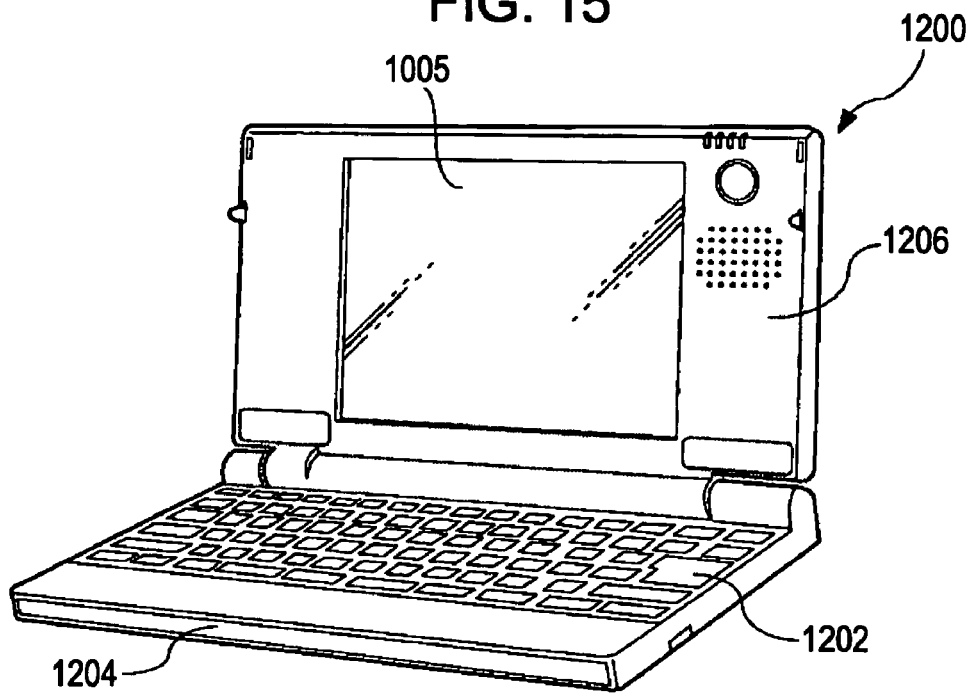
FIG. 15 is a cross-sectional view showing a construction of the personal computer which is an aspect of an electronic apparatus applying an electro-optical device in accordance with the invention.
Figure 16:
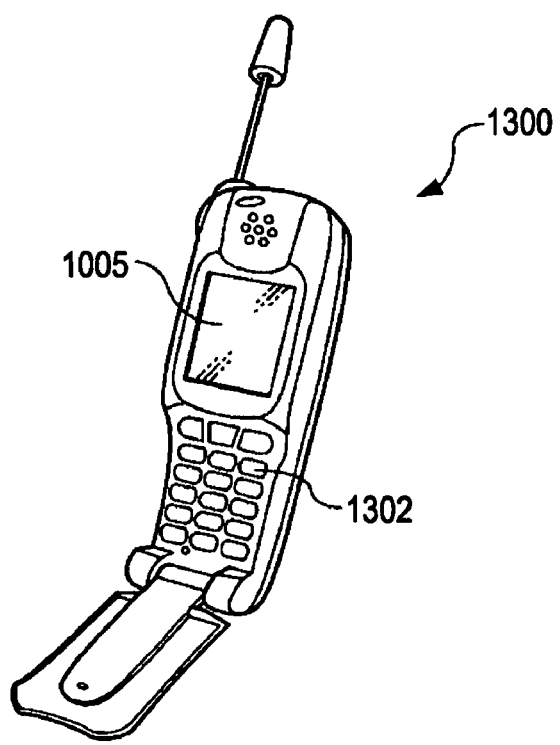
FIG. 16 is a cross-sectional view showing a construction of the cellular phone which is an aspect of an electronic apparatus applying an electro-optical device in accordance with the invention.

Next, the case where the above-mentioned liquid crystal device is applied to various electronic apparatuses will be described with reference to FIG. 13 to FIG. 15.

7-1: Projector

To begin with, a projector using the above-mentioned liquid crystal device as a light valve will be described. FIG. 13 is a plan layout drawing which shows a configuration example of the projector.

In FIG. 13, a lamp unit 1102 constituted by a white light source such as a halogen lamp is provided inside a projector 1100. Projection light emitted from the lamp unit 1102 is divided into three primary colors RGB by means of four mirrors 1106 and two dichroic mirrors 1108 which are disposed within a light guide 1104. Then, the divided color lights enter light valves 1110R, 1110B and 1110G respectively corresponding to each primary color. These light valves 1110R, 1110B and 1110G are respectively constituted by liquid crystal modules including liquid crystal device.

In the light valves 1110R, 1110B and 1110G, a liquid crystal panels 100 are driven by primary color signals R, G and B which are supplied from an image signal supplying circuit 300. Light modulated by the liquid crystal panels 100 enters from the 3 direction to a dichroic prism 112. In the dichroic prism 112, lights of R and B are refracted at 90 degree angle, and on the other hand, light of G goes straight. Therefore, images made of respective colors are combined, with the result that a color image is projected on a screen or the like by way of a projection lens 1114.

Here, with respect to display images formed by respective light valves 1110R, 1110B and 1110G, a display image formed by the light valve 1110G is needed to be flipped horizontally for display images formed by the light valves 1110R and 1110B.

Incidentally, color filters is not needed for the light valves 1110R, 1110B and 1110G because the dichroic mirrors 1108 make light corresponding to respective primary colors R, G and B enter the light valves.

7-2: Mobile Computer

Next, an example in which the above-mentioned liquid crystal device is applied to a mobile personal computer will be described. FIG. 14 is a perspective view showing a construction of the personal computer. In FIG. 14, a computer 1200 is constituted by a main body 1204 provided with a key board 1202 and a liquid crystal display unit 1206. The liquid crystal display unit 1206 is constructed such that back lights are mounted on the back of the above-described liquid crystal device 1005.

7-3: Cellular Phone

Additionally, an example in which the above-mentioned liquid crystal device is applied to a cellular phone will be described. In FIG. 14, a cellular phone 1300 includes a plurality of operating buttons 1302 and a reflective-type liquid crystal device 1005. In the reflective-type liquid crystal device 1005, front lights are provided in the front thereof as required.

Except for the electronic apparatuses described with reference to FIGS. 13 to 15, the following are applicable: liquid crystal televisions, viewfinder type and monitor type video tape recorder, car navigation system, pager, personal digital assistant, calculator, word processor, workstation, videophone, point-of-sale terminal, and apparatus having a touch panel. Also, an electro-optical device according to the invention can be applied to LCOS (Liquid Crystal on Silicon). Here, LCOS means a liquid crystal panel in which MOSFET constituted by CMOS is formed on a single crystal silicon substrate, and on the MOSFET a liquid crystal layer is formed. Since a single crystal silicon substrate will not transmit light, an LC mode is reflective type. In some cases MOSFET is used for a peripheral drive circuit or, as required, for a control circuit to control signals, in addition to usage in a switching element of pixel area. Transistors provided in LCOS are constructed such that n-type and p-type MOSFET is formed on a silicon substrate through an LSI process. The display type of LCOS is a reflective type, so that Al electrodes may be used as picture electrodes to improve the light reflectivity in some cases. Needless to say, an electro-optical device according to the invention is applicable to the various types of electronic apparatus.

The invention is not limited to the above-described embodiments, and various changes may be made without departing from the scope or ideas of the invention which can be read from the claims and the entire specifications. Therefore, an electro-optical device with such variations and an electronic apparatus having the device are included in the technical scope of the invention.

The entire disclosure of Japanese Patent Application Nos. 2005-154112, filed May 26, 2005, and 2006-004527, filed Jan. 12, 2006, are expressly incorporated by reference herein.

What is claimed is:

1. An electro-optical device, comprising:
   a data line and a scanning line that intersect each other;
   a transistor supplied with a scanning signal by the scanning line;
   a pixel electrode supplied, through the transistor, with an image signal from the data line; and
   a holding capacitor including a first electrode electrically connected to the transistor and the pixel electrode, a second electrode disposed opposite to the first electrode and electrically connected to a capacitor wiring, and a multilayer dielectric film structure including:
      a low dielectric film consisting of a high temperature oxide film;
      a first high dielectric film disposed between the first electrode and the low dielectric film, the first high dielectric film consisting of a silicon nitride film; and
      a second high dielectric film disposed between the low dielectric film and the second electrode, the second high dielectric film consisting of a silicon nitride film, the first high dielectric film and the second high dielectric film having a permittivity relatively higher than a permittivity of the low dielectric film, the second high dielectric film having a thicker film thickness than the first high dielectric film;
   wherein the holding capacitor is disposed above a semiconductor layer of the transistor; and
   wherein stack-layer positions of the first high dielectric film and the second high dielectric film in the direction toward the first electrode and the second electrode, respectively, are symmetrical with respect to the low dielectric film; and
   wherein the multilayer structure is formed by stacking silicon nitride films of the same number on both sides of the high temperature oxide film.

2. The electro-optical device according to claim 1, wherein the second electrode is held at a reference voltage potential;
   wherein the second high dielectric film is electrically connected to the second electrode; and
   wherein a voltage with a voltage different from the reference voltage potential is sequentially applied to the pixel electrode via the first electrode.

3. The electro-optical device according to claim 2, wherein the second high dielectric film is formed on the second electrode.

4. The electro-optical device according to claim 1,
   wherein the plurality of pixel electrodes are arranged on the substrate in a matrix; and wherein different polarity voltages are applied to:
different pixel lines of the plurality of pixel electrodes arranged in the matrix,
different pixel rows of the plurality of pixel electrodes arranged in the matrix,
different pixel electrodes adjacent in both a row and line directions, or
different groups controlled as different fields.

* * * * *